(12) United States Patent
Braun et al.

(10) Patent No.: US 7,164,699 B1
(45) Date of Patent: Jan. 16, 2007

(54) COMPACT, HIGH-POWER, LOW-JITTER, SEMICONDUCTOR MODELOCKED LASER MODULE

(75) Inventors: Alan Michael Braun, Lawrenceville, NJ (US); Joseph H. Abeles, East Brunswick, NJ (US); Martin H. Kwakernaak, New Brunswick, NJ (US); Viktor Borisovitch Khalfin, Hightstown, NJ (US)

(73) Assignee: Sarnoff Corporation, Princeton, NJ (US)

( * ) Notice: Subject to any disclaimer, the term of this patent is extended or adjusted under 35 U.S.C. 154(b) by 350 days.

(21) Appl. No.: 10/859,553

(22) Filed: Jun. 1, 2004

Related U.S. Application Data

(60) Provisional application No. 60/548,733, filed on Feb. 27, 2004, provisional application No. 60/548,732, filed on Feb. 27, 2004, provisional application No. 60/474,539, filed on May 30, 2003.

(51) Int. Cl.
*H01S 3/13* (2006.01)
(52) U.S. Cl. .................................. 372/29.022
(58) Field of Classification Search ........... 372/29.022
See application file for complete search history.

(56) References Cited

U.S. PATENT DOCUMENTS

| 5,408,439 | A * | 4/1995 | Urmson .................... 367/1 |
| 6,339,474 | B1 * | 1/2002 | Paiam et al. .............. 356/480 |
| 2003/0161375 | A1 * | 8/2003 | Filgas et al. ............... 372/66 |

OTHER PUBLICATIONS

Kanka et al. Characterisation of a Modulational-Instability Sigma-Cavity Fibre Laser. OFMC '01. Sep. 26-28, 2001.*
Deparis et al. Polarization-Maintaining Fiber Bragg Gratings for Wavelengt Selection of Actively Mode-Locked Er-Doped Fiber Lasers. IEEE Photonics Technology Letters, vol. 13, No. 4, Apr. 2001.*

* cited by examiner

*Primary Examiner*—Deandra M. Hughes
(74) *Attorney, Agent, or Firm*—Lowenstein Sandler PC

(57) ABSTRACT

A low-jitter optical pulse source including: a monolithic waveguide including a first section substantially perpendicular to a first facet and a second section being curved and substantially non-perpendicular to a second facet; and, an optical circulator coupled to the monolithic waveguide and forming a sigma cavity in combination with the monolithic waveguide, wherein the first facet forms a sole reflector for the sigma cavity.

14 Claims, 13 Drawing Sheets

COMPACT, HIGH-POWER, LOW-JITTER, SEMICONDUCTOR MODELOCKED LASER MODULE

RELATED APPLICATIONS

This application claims priority of: U.S. Patent Application Ser. No. 60/474,539, entitled LOW JITTER MODELOCKED LASER MODULE UTILIZING PACKAGE LOW-CAPACITANCE ELEMENTS filed May 30, 2003; U.S. Patent Application Ser. No. 60/548,732, entitled HYBRID SEMICONDUCTOR/FIBER SIGMA-CAVITY FOR LOW-JITTER MODELOCKED LASER, filed Feb. 27, 2004; and, U.S. Patent Application Ser. No. 60/548,733, entitled LOW TIMING-JITTER MODELOCKED LASER SOURCE, filed Feb. 27, 2004, the entire disclosures of each of which are hereby incorporated by reference as if being set forth in their respective entireties herein.

GOVERNMENT LICENSE RIGHTS

The U.S. Government has a paid-up license in this invention and the right in limited circumstances to require the patent owner to license others on reasonable terms as provided for by the terms of Contract number DAAD17-99-C-0062 awarded by the U.S. Army Research Laboratory, and under and Contract DAAD17-02-C-0094 also awarded by the U.S. Army Research Laboratory, and under subcontract to DARPA/DSO Prime Contract MDA972-03-C-0043

FIELD OF INVENTION

The present invention relates to mode locked lasers and high frequency, low jitter pulsed optical sources.

BACKGROUND OF THE PRESENT INVENTION

Compact sources of high-frequency low-jitter picosecond optical pulses are desired for applications such as high-resolution photonic analog-to-digital conversion, arbitrary RF waveform generation, RF-photonic channelization, RF-photonic radar signal processing, coherent optical signal processing, spectrally efficient photonic transmission systems, and photonic synthesis of low phase noise RF tones. For all these applications, the distinguishing feature is the low-jitter characteristic. By way of example, photonic analog-to-digital (A/D) converters (ADC's) have the potential to achieve high resolution, high bandwidth sampling beyond the capability of current electronic ADC's, but require low jitter pulsed optical sources. For example, a 10-bit 10-GS/s photonic A/D system may require an aperture jitter below 30-fs.

Typically, jitter values are inferred from measured phase noise profiles. Phase noise may be measured relative to a high-quality RF source which simultaneously acts as reference and as the active modelocking source for an optical source, using, e.g., commercially available phase noise test sets such as the E5501 manufactured by Agilent, Inc. These residual phase noise profiles are typically characterized by a white noise plateau starting at offset frequencies close in to the carrier (~10 Hz) and extending to a characteristic roll-off frequency. For harmonically modelocked lasers, this roll-off frequency is much less than Nyquist frequency and the phase noise profile includes the presence of supermode spurs at offset frequencies corresponding to harmonics of the longitudinal mode spacing, a characteristic of harmonically modelocked lasers independent of the gain media used.

SUMMARY OF THE INVENTION

A low-jitter optical pulse source including: a monolithic waveguide including a first section substantially perpendicular to a first facet and a second section being curved and substantially non-perpendicular to a second facet; and, an optical circulator coupled to the monolithic waveguide and forming a sigma cavity in combination with the monolithic waveguide, wherein the first facet forms a sole reflector for the sigma cavity and a low phase noise RF generator.

BRIEF DESCRIPTION OF THE FIGURES

Understanding of the present invention will be facilitated by consideration of the following detailed description of the preferred embodiments taken in conjunction with the accompanying drawings, in which like numerals refer to like parts, and.

DETAILED DESCRIPTION OF THE PREFERRED EMBODIMENTS

Figure 1:
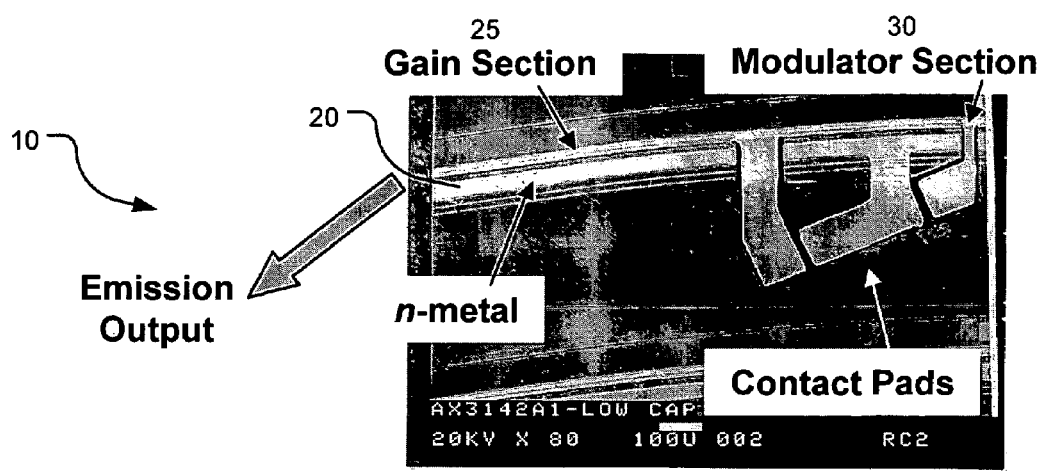
FIG. 1 illustrates a gain device according to an aspect of the present invention.

It is to be understood that the figures and descriptions of the present invention have been simplified to illustrate elements that are relevant for a clear understanding of the present invention, while eliminating, for purposes of clarity, many other elements found in modelocked lasers, sigma cavities, circulators, etalons and line delay sources and methods. Those of ordinary skill in the art will recognize that other elements may be desirable in implementing the present invention. However, because such elements are well known in the art, and because they do not facilitate a better understanding of the present invention, a discussion of such elements is not provided herein.

According to an aspect of the present invention, low-capacitance, curved-waveguide, multi-section, gain elements may be fiber pigtailed within standard sized butterfly-style packages incorporating a high-frequency RF input (e.g., >20-GHz). Such a device may be incorporated into a modelocked laser cavity and used to generate ultrashort (picosecond or less) optical pulses with a fixed period between pulses, the period being related to the cavity roundtrip frequency or a harmonic thereof.

The fundamental cause of jitter is spontaneous emission causing random perturbations to the lasing optical modes. Spontaneously emitted photons add randomly (amplitude and phase) to the given lasing optical mode. On each round trip, this translates to a net change in the center of moment of the optical pulse, leading to pulse-to-pulse jitter. This jitter can be expressed in the frequency domain by a white-like phase-noise profile. According to an aspect of the present invention, a low loss cavity may be used to reduce the peak value of that white noise spectrum. This cavity is either defined monolithically or within an external resonator, and a specific low-loss semiconductor layer structure is defined for each case. Further, an extended harmonically modelocked cavity may provide low-pass phase noise filtering, reducing the maximum offset frequency where noise occurs effectively suppressing the high-frequency noise.

According to an aspect of the present invention, curved waveguide low-capacitance multi-section gain elements may be used with external cavity modelocked laser sources. Such a gain element may be used within an external resonator to generate modelocked laser pulses. A single-mode waveguide, normal to one facet, may at least partially form a substantially continual curve ending at the opposing facet with an about 6° angle from the normal. Facets may be nominally coated HR/AR. Independent gain and modulation sections may be defined along a laser ridge. The modulation section may abut a rear, HR-coated facet to enhance pulse shortening and define a rear reflector of the cavity. Low parasitic capacitance may be achieved by etching isolation trenches through to the n-substrate alongside the ridge, restricting the width of a p-metal surrounding the ridge, limiting the size of contact pad, and incorporating a thick, low-dielectric material, such as Cyclotene (benzocyclobutane), underneath the contact pads.

According to an aspect of the present invention, low-capacitance, multi-section, curved-waveguide gain elements may be packaged with lensed polarization-maintaining fiber, or standard single mode fiber, within butterfly-style packages to produce low-jitter pulses when used within a harmonically modelocked sigma-, external-cavity laser. Achievable jitter may approach 25 fs for frequencies between about 10 Hz and about 10 MHz. Methods exist for suppressing supermode spurs, such as those proposed by P. J. Delfyett, Jr., CREOL, and are capable of achieving greater than 25 dB suppression. A module containing the in-line sigma-cavity modelocked laser source and at least one packaged semiconductor optical amplifier may be used as a configurable low jitter pulse source.

According to an aspect of the present invention, a realized device may incorporate modelocked laser gain, high-frequency modulation, and cavity end mirroring on a single chip. The phase noise (related to timing jitter) of the modelocked laser can be reduced through the use of a high-Q, low-optical-loss, laser cavity. The phase noise profile as a function of frequency offset from the carrier may be recognized as a white-noise level plateau up to a "knee" frequency where the phase-noise rolls off to the system noise floor. For external cavity modelocked lasers, the phase noise knee frequency may be inversely proportional to the overall cavity length. Longer cavities may exhibit the same phase noise plateau, but with a rolloff frequency closer to the carrier than a shorter cavity. This directly leads to a reduced value of integrated phase noise, and hence a reduced timing jitter. The phase noise plateau is affected by internal cavity losses, with reduction in losses (hence needed gain) leading to a reduced timing jitter. Thus, high harmonic modelocked lasers (modulation frequency equal to a harmonic of the cavity frequency) with larger cavity Q than shorter laser resonators exhibit a reduced integrated low-frequency phase noise and hence timing jitter. Lasers based on the latter principle are a feature of the present invention.

Further, the phase noise plateau level is affected by internal cavity losses, with reduction in losses leading to a reduced timing jitter. This is a direct consequence of jitter being derived from background spontaneous emission. For lasing to occur, gain is equal to the cavity loss and the total spontaneous emission power is linked to that needed cavity gain. Reduction of the cavity loss leads to reduction in the required gain and hence reduced spontaneous emission power. Since spontaneous emission causes jitter, reduction of the cavity loss causes reduction of jitter. Lasers based on the latter principle are a feature of the present invention. A curved waveguide, two-section, gain element greatly reduces cavity losses in an external cavity by requiring only a single chip-to-cavity coupling stage. High reflection coating on the back of chip integrates the cavity end mirror on-chip. Curved waveguide with anti-reflection coated facet reduces on-chip Fabry-Perot reflections and allows low-loss coupling to the external resonator. A curved waveguide with an anti-reflection coated facet reduces on-chip Fabry-Perot reflections and allows low-loss coupling to the external resonator. The radius of curvature may be chosen to minimize optical radiation losses associated with bending and it is a principle of the present invention that this be accomplished by reducing the overlap of optical mode that would otherwise exceed the speed of light and therefore must radiate to levels of less than $10^{-4}$. This criterion leads to a radius of curvature of approximately 1 cm for conventional ridge guide waveguides of ca. 3 microns width. One or more high reflection coatings on the back of the chip and highly reflective output couplers reduce mirror losses.

For extended monolithic devices (such as ~4.4 mm long for 10 GHz operation) both the effective mirror losses and waveguide losses may be low (few $cm^{-1}$). Under this condition, the operating current density of the modelocked laser may be near the transparency current density, such that spontaneous emission rate will be close to that at the transparency point. Therefore, to minimize spontaneous emission coupled into the lasing mode, a low optical confinement structure may be used.

By way of non-limiting example only, a low confinement 2 quantum well structure may be used and formed upon an n-InP substrate. A 1500 nm thick n-In P n-cladding layer doped to about n-$10^{18}$ $cm^{-3}$ may be deposited upon the substrate. A 30 nm thick 1100Q confinement layer may be deposited upon the n-cladding. A 10 nm thick 1250Q internal waveguide may be deposited upon confinement layer. A 9 nm thick quantum well layer may be deposited upon the internal waveguide. A 12 nm thick 1250Q barrier layer may be deposited upon the first quantum well layer. A 9 nm thick second quantum well layer may be deposited upon the first barrier. Another 10 nm thick 1250Q internal waveguide may be deposited upon the second quantum well layer. A second 30 nm thick 1100Q confinement layer may be deposited upon second internal waveguide. A 20 nm thick $In_{0.8}Ga_{0.2}P$ blocking layer may be deposited upon second confinement layer. A graded p-cladding may be provided by: depositing a 570 nm thick p-InP spacer doped to p-$10^{17}$ $cm^{-3}$. Upon the blocking layer, followed by a 30 nm thick 1100Q etch stop layer doped to p-$10^{17}$ $cm^{-3}$, followed by a 1500 nm thick p-InP cladding layer doped to p-$10^{18}$ $cm^{-3}$. Finally, an InGaAs:Zn cap may be deposited upon the cladding, and a metal contact may be deposited upon the cap.

This includes a reduced number of quantum wells as well as reduced overlap of the optical mode with quantum well region. Further, to reduce optical losses, a graded p-doping profile is needed. In the structure specifically implemented, the p-cladding is a total thickness of 2100 nm with a doping density of ~$1 \times 10^{18}$ $cm^{-3}$ for the initial 1500 nm, p-doping reduced to $1 \times 10^{17}$ $cm^{-3}$ for the remaining 600 nm nearest to the quantum wells. With an external cavity laser operating according to these principles, current density is not near the transparency current density. To achieve maximal gain per photon, pumping to full inversion may be used in the condition of logarithmic dependence of gain on current density. In this regime, increased current density causes increased spontaneous emission in the form of broadband emission. To operate in the more linear gain/current density regime, a high confinement factor waveguide structure may be used.

By way of further non-limiting example only, a high confinement 3 layer quantum well structure may be used and formed upon an n-In—P substrate. First, a 1500 nm thick n-InP n-cladding layer doped to n-$10^{18}$ $cm^{-3}$ may be provided upon the substrate. Next, a 170 nm thick 1100Q confinement layer may be provided. Next, a 10 nm thick 1250Q internal waveguide layer may be provided. A 9 nm thick first quantum well layer may be provided upon the first confinement layer, with a 12 nm thick 1250Q first barrier layer provided next. A second 9 nm thick quantum well layer may then be provided, with another 12 nm thick 1250Q second barrier layer thereupon. Finally, a third 9 nm thick quantum well layer may be provided upon the second barrier layer. Next, a 10 nm thick 1250Q internal waveguide layer may be provided, followed by a 170 nm thick 1100Q confinement layer and a 20 nm thick $In_{0.8}Ga_{0.2}P$ blocking layer. A graded p-cladding may be provided by using: a 300 nm thick p-InP spacer layer doped to p-$10^{17}$ $cm^{-3}$ deposited upon the blocking layer, followed by a 30 nm thick 1100Q etch stop layer doped to p-$10^{17}$ $cm^{-3}$ and a 1500 nm thick p-InP cladding layer doped to p-$10^{18}$ $cm^{-3}$. Finally, an InGaAs:Zn cap doped to p-$10^{19}$ $cm^{-3}$ may be deposited with a metal contact provided thereon.

By way of further non-limiting example only, a high confinement 5 quantum well structure may be used and provided on an n-InP substrate. A 1500 nm thick n-InP n-cladding doped to n-$10^{18}$ $cm^{-3}$ may be provided upon the substrate. A 130 nm thick 1100Q confinement layer may be provided thereupon. Next, a 10 nm thick 1250Q internal waveguide layer may be provided on the confinement layer, followed by a 9 nm thick first quantum well layer, and first 12 nm thick 1250Q barrier layer. A second 9 nm thick quantum well layer may be deposited upon the first barrier, followed by a second 12 nm thick 1250Q barrier layer, 9 nm thick third quantum well layer, 12 nm 1250Q thick third barrier layer, a 9 nm thick fourth quantum well layer, a 12 nm thick 1250Q fourth barrier layer, and 9 nm thick fifth quantum well layer. A 10 nm thick 1250Q internal waveguide layer may be provided on the fifth quantum well layer, followed by a 130 nm thick 1100Q second confinement layer and 20 nm thick $In_{0.8}Ga_{0.2}P$ blocking layer. A graded p-cladding may be provided via: a 300 nm thick p-InP spacer layer doped to p-$10^{17}$ $cm^{-3}$, followed by a 30 nm thick 1100Q etch stop layer doped to p-$10^{17}$ $cm^{-3}$, followed by a 1500 nm thick p-InP cladding layer doped to p-$10^{18}$ $cm^{-3}$. Finally, an InGaAs:Zn cap doped to p-$10^{19}$ $cm^{-3}$ may be provided with a metal contact.

To minimize spontaneous emission it is needed to minimize the drive current at the operating point of the laser. Waveguide losses can be minimized by grading the doping level in the p-cladding layer to reduce free carrier absorption by reduced overlap with the optical mode. In this specific structure implementation, graded p-doping takes the form of ~$1 \times 10^{18}$ $cm^{-3}$ for the initial 1500 nm p-cladding region, ~$1 \times 10^{17}$ $cm^{-3}$ for the remaining 300 nm p-cladding "spacer" layer closest to the quantum wells.

According to an aspect of the present invention, a novel sigma cavity is constructed which incorporates a curved-waveguide, multi-section, low-capacitance, semiconductor gain element into the tail of the sigma cavity at least partially defined by an optical circulator. The gain element, besides providing gain, modulation, and saturable absorption, acts as the sole retroreflector in the cavity. The loop utilizes the circulator in a different than typical fashion, with input from the sigma tail into port 2, and a fiber loop from port 3 to port 1. This loop, due to optical isolation from the circulator, provides uni-directional pulse propagation. That is, the circulator provides a junction between a linear and unidirectional ring cavity. Therefore, various elements, such as a high-finesse etalon (spur suppression filter), bandpass filter, and/or variable delay line can be incorporated into the laser cavity without incurring reflections detrimental to the modelocking process.

According to an aspect of the present invention, high average power modelocked laser systems utilizing cascaded semiconductor optical amplifiers with mid-span filtering may be realized. Achievable power levels directly from semiconductor modelocked lasers may be in the range of 1.0 mW, due to operation close to threshold. Amplification in a semiconductor optical amplifier (SOA) may be used, and possibly limited, to the 10 mW level due to competition of the injected pulse train with the amplified spontaneous emission (ASE) at high pump current densities, leading to large background ASE. Amplification to the 100 mW level may be achieved using a cascaded amplification system. In this scheme, a first SOA may be used to amplify the pulse train to the 10 mW level; the pump current density set at a level where minimal ASE is added to the output pulse train. The output of this relatively strong "pre-amplifier" may be injected into a "power-amplifier" SOA of length on the order of 2 mm. To mitigate a large portion of the final amplified power being made up of background ASE, a bandpass filter may be incorporated between the amplification stages to suppress the ASE coupling from the first amplifier injected into the power amplifier. With a high average power injection into the second amplifier, high pump current densities can be utilized before competition with ASE occurs. Inclusion of Faraday isolation before each amplification stage prevents back coupling of optical power into SOAs. An integrated multi-stage amplifier system is feasible with midspan grating passband filtering.

According to an aspect of the present invention, two-section, curved-waveguide, low-capacitance InP or GaAs based devices may be used for low-noise 10-GHz active modelocking. Referring now to FIG. 1, there is shown a view of a device 10 according to an aspect of the present invention. Device 10 may serve to integrate gain, saturable absorber and modulation, and cavity end-mirror functions onto a single device. Generally, device 10 may include a 50-µm long saturable absorber/modulator section substantially normal to a high-reflectivity (HR)-coated rear facet, and a longer curved gain section forming an about 6° angle from normal at an emitting, anti-reflective (AR)-coated, front facet. Low-capacitance may be achieved by both selective p- and n-metal patterning as well by including a patterned dielectric to isolate the contact pads. Use of a curved-waveguide and AR-coated front facet allows coupling to an external end-mirror by high numerical-aperture optics while minimizing intra-cavity reflections. According to an aspect of the present invention, the back cavity end-mirror may be formed by the HR-coated rear facet. This facet may be coated greater than 70%, for example. This allows construction of an external cavity actively modelocked laser having a single diode coupling stage and integrated gain/modulation functionality.

Figure 2:
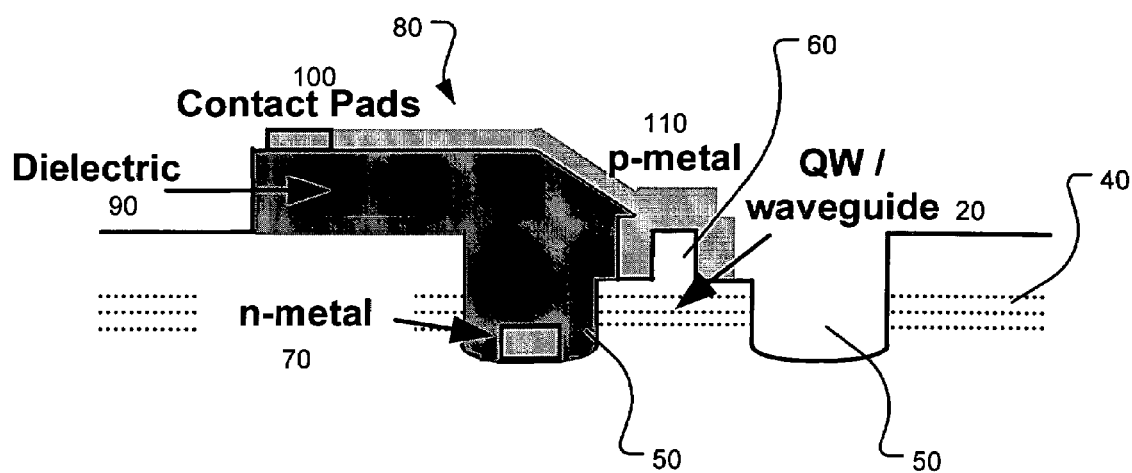
FIG. 2 illustrates a cross-sectional diagrammatic representation of a gain element suitable for use as the gain element of FIG. 1.

Referring now to FIGS. 1 and 2, there are shown an SEM micrograph and cross-sectional diagrammatic representation of a gain element 10 that may be used according to an aspect of the present invention. The low-capacitance, two-section gain element 10 may be used for low-jitter harmonically modelocked laser cavities.

The modelocked laser gain element 10 may include a low-capacitance, curved, two-section InGaAsP based active waveguide 20 forming a gain region 25 and saturable absorber/modulator region 30. Gain element 10 may include compressively strained quantum wells 40, such as three compressively strained quantum wells. A parasitic capacitance of less than 0.4 pF may result from fabricating deeply etched trenches 50 substantially parallel to and ~15 µm from a ridge 60 of waveguide 20. Trenches 50 may reach an n-cladding or n-substrate 70 and allow electrical contact from a p-side or layer 80. A patternable dielectric 90 may serve to isolate contact pads 100 from other portions of semiconductor device 10 and mitigate capacitance. For the specific devices fabricated, a planarizing, photodefinable BCB (Benzocyclobutene) may be used to bring the contact pads over the isolation trench and onto the ridge. Thicknesses between about 2.5 and 5 µm under the contact pads may be used. A patterned p-metal 110 may be deposited over dielectric 90 and waveguide 20. Contact pads may be configured as coplanar stripeline for impedance matched RF drive.

By way of non-limiting example only, waveguide 20 may include an about 51 nm thick InGaAs:Zn cap deposited upon a 1500 nm thick InP:Zn p-cladding. This may be deposited upon a 30 nm thick 1100Q:Zn etch stop layer. Which, may in turn be deposited upon a 300 nm thick InP:Zn spacer layer. The spacer layer may be deposited upon a 20 nm thick GaInP blocking layer, which is deposited upon a 130 nm thick 1100Q confinement layer. The confinement layer may be deposited upon a 10 nm thick 1250Q barrier layer, in turn deposited upon an 8 nm thick InGaAsP QW layer. The quantum layer stack may also include another 12 nm thick 1250Q barrier layer upon an 8.3 nm thick InGaAsP QW layer upon another 12 nm thick 1250Q barrier layer upon another 8 nm thick InGaAsP QW layer upon another 10 nm thick 1250Q barrier layer. The quantum stack may be deposited upon a 130 nm thick 1100Q confinement layer, deposited upon a 1500 nm thick n+ InP:Si cladding layer. This entire structure may be deposited upon a conventional n+ InP, or semi-insulating, substrate. An independent p-metal may be formed around ridge utilizing standard liftoff techniques to minimize metal extent. A graded doping profile, examples of which are presented herein, may be effected in the p-cladding to further allow for a low loss optical structure.

Curvature of waveguide 20 may allow one to integrate a high-reflectivity facet mirror with a low effective-reflectivity output to control intracavity reflections and prevent spectral modulation. For example, waveguide 20 may have a curvature angle of ~6° to the output facet normal, providing a reflection $<10^{-5}$. Of course, other angles may be used depending upon design criteria. Nonetheless, waveguide radius of curvature may be maintained above a value of ~5 mm to minimize bending losses. An ~3% coating may further reduce reflections. The HR-coated rear facet integrates a low-loss cavity end mirror.

The p-type cap layer of ridge 60 may be etched to define the active section of element 10, a short section abutting the HR-coated facet and functioning as the modulator and saturable absorber region 30, and a longer section providing gain region 25. Modulator section 30 may be about 50 µm long, and gain section may be about 0.6 mm to about 1.5 mm long. The etched region may be about 3 to 4 µm wide and about 10 µm wide, by way of non-limiting example only.

Standard photolithography may be used to form curved ridge waveguide 20 to have a width of about 3–4 µm and a straight 60 µm long section followed by a curve ending at an angle of 6° from normal to the facet. The curve angle may be substantially constant. Total chip length may be about 600 µm–1500 µm. The two electrically-independent sections may be formed by etching a small portion of a highly doped p-cap on ridge at a position following 60 µm straight portion of ridge contour. Lateral resistance may be on the order of 1 kΩ, much greater than vertical resistance seen by carriers. Frequency response, as well as phase noise profile, is influenced by on-chip parasitic capacitance, reduction of parasitic capacitance increasing frequency response, reducing phase noise.

The laser may be modelocked by simultaneously applying reverse and RF signal biases to the modulator section 30 via contacts 100. Around 38 mA of DC bias may be suitable to excite gain section 30, for example. By way of further example, the majority of the waveguide may be forward biased and used as the cavity gain element. The short (<100 um) modulation section, the portion of the device with waveguide normal to the facet, allowing for increased pulse-shortening due to pulse-interference effects, may be reverse biased and have RF power applied thereto to achieve passive, active, or hybrid modelocking. The modulated saturable absorber section is utilized for stable optical pulse forming. When reversed biased, the modulation section acts as a modulatable saturable absorber, providing optical loss for ASE energy between pulses and causing pulse edge steepening due to saturated absorption. Fast carrier recombination may allow for trailing edge pulse shaping. For condition of strong reverse bias (i.e, >3.5 V), the laser will passively modelock at a repetition rate equivalent to the round trip cavity frequency (fundamental or extended cavity). In this case, there is no active synchronization with an external clock source and due to pulse wander, passive modelocking results in increased phase noise close to the carrier. For hybrid modelocking, the reverse bias is typically ~2 V used along with applied RF drive power. The reverse bias allows absorption of optical ASE energy between pulses. The high frequency RF drive (e.g., ~10 GHz) reduces absorption at time intervals equal to modelocking rate (fundamental or harmonic modelocking) and provides an accurate and bounded optical gain window referenced to an external RF source. This is especially needed for generation of harmonic modelocked laser from external cavity resonators. In this case the RF drive forces cavity loss to be modulated at a rate equal to a harmonic of the cavity rate, producing stable, high frequency, optical pulse train. For residual phase noise measurements, the measurement is made with respect to this external RF drive signal resulting in the phase noise contribution from modelocked laser above that of the RF source. For hybrid modelocking, phase noise profile is flat from low offset frequency (~10 Hz) to phase noise roll-off frequency.

Figure 7:
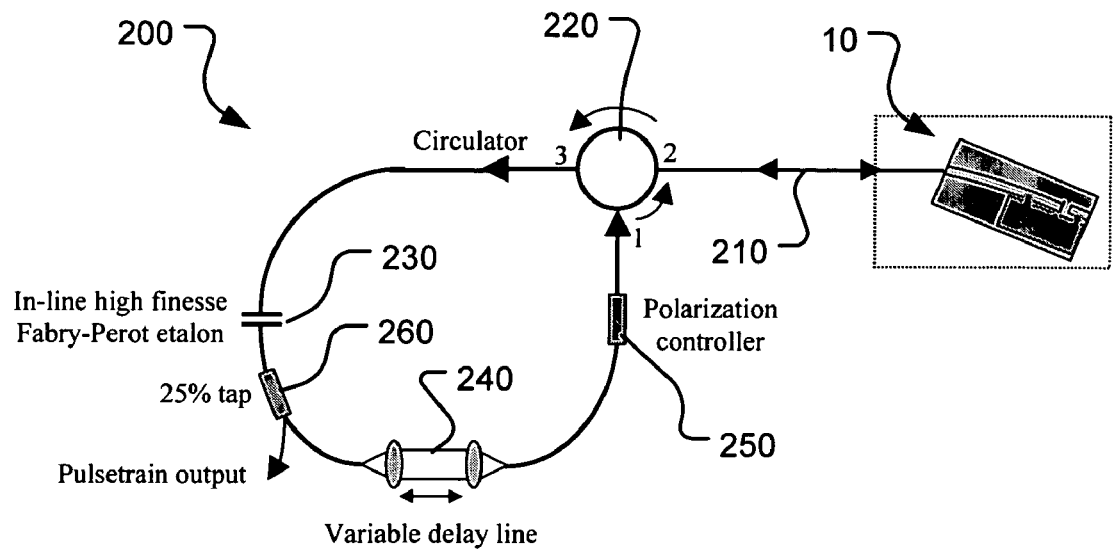
FIG. 7 illustrates a schematic view of a sigma-cavity laser according to an aspect of the present invention. A two-section source device is shown in the tail of the sigma cavity and serves as the cavity reflector. The uni-directional loop formed by the circulator allows incorporation of elements used for low-jitter modelocking.

Referring now also to FIG. 7, there is shown a diagrammatic representation of a system 200 according to an aspect of the present invention. The two-section source device 10 is in the tail of the sigma cavity and serves as the only cavity reflector. The uni-directional loop formed by the circulator allows incorporation of elements used for low jitter modelocking, including variable delay line, passband filter, polarization controller, and/or Fabry-Perot filter. More particularly, device 10 may be used in the tail of an external cavity sigma laser 200 formed with an in-line optical circulator 220 as is shown in FIG. 7. Gain element 10 may be optically coupled, via an AR-coated lensed-tipped optical fiber or other waveguide 210 for example, to port 2 of a three-port circulator 220.

Generally, a three-port circulator allows light to travel in only one direction—i.e., from port 1 to port 2, from port 2 to port 3. Any light reflected back from port 2 is directed not back to port 1, but on to port 3. This device is traditionally used by sending light from port 1→2 and then output from 2→3 (some optical element in the arm of port two). However, in the current implementation, the circulator is arranged for optical power to input onto port 2 of the circulator (2→3) with the loop formed from port 3→1 and the circulator relaying this optical power from 1→2 back towards the semiconductor gain element. Due to high isolation in the backward direction, light can not propagate in the reverse direction, creating a unidirectional loop stable against device reflections.

Generally, a passband filter (not pictured) may serve to wavelength filter and tune output from port 2 of circulator 220. Fabry-Perot etalon 230 may serve to suppress supermode spurs, as was proposed by communication P. Delfyett, CREOL. The free spectral range of an etalon is the frequency interval from one interference order to the next. The finesse is the ratio of the free spectral range to the full width at half maximum of the etalon's bandpass. In general, with a free spectral range equal to the ratio of modelocking rate divided by cavity roundtrip rate, the Fabry-Perot etalon may suppress harmonic-modelocked phase noise "spurs" at offset frequencies corresponding to the cavity roundtrip frequency and harmonics. The output of etalon 230 may be photonically coupled to an input of an optical tap 260. Tap 260 may provide a certain percentage of signal input thereto on a first output and the remainder of its input on a second output. Tap 260 may be a 25% tap, for example. Tap 260 may serve to provide a pulsetrain output from system 200 as well as in input to a variable delay device or line 240.

A system 200 output may be photonically coupled to a first output of tap 260. This first output may be a roughly 25% output. A second output of tap 260 may be photonically coupled to an input of variable delay device 240. Variable delay line 240 may serve to simulate different photonic coupling lengths between its input and output in a tunable fashion by introducing tunable delays into the transmission. Variable delay line 240 may serve to match round trip cavity length to a harmonic of the hybridly-driven RF frequency (such as 10 GHz). Fine tuning of the cavity length to RF frequency is desirable where RF is fixed—i.e., part of a larger system running from a master clock. The output of delay line 240 may be photonically coupled to an input of a polarization controller 250, the output of which is photonically coupled to port 1 of circulator 220.

Polarization controller 250 may serve to reduce cavity loss by setting polarization such that the optical power is directed by optical circulator with polarization state needed for maximal gain within low-capacitance semiconductor gain element.

By way of further, non-limiting example only: circulator 220 may take the form of a New Focus model CIR10AN32N-00; delay device 240 may take the form of a Santec model VDL-FFB25-S-1550-X/Y-FC/APC2; etalon 230 may take the form of a Micron Optics model FFP-I 1550-015M650-5.5 080; polarization controller 250 may take the form of a FiberPro model PC1100-15-F/A; tap 260 may take the form of a Wavesplitter model CBNS-5125P-L11X 25% optical tap.

In general, the use of a sigma cavity as has been described offers advantages over a ring or linear cavity. With the HR coated devices, only a single diode coupling stage is needed (as opposed to a ring cavity) while items such as the etalon filter can be incorporated into the uni-directional loop without encountering difficulties associated with intracavity reflections (as in linear cavities). According to an aspect of the present invention, a basic sigma-cavity may be constructed using high numerical aperture bulk optics for diode-fiber coupling and a polarization controller within the sigma loop. Such a cavity may not include the etalon or delay line.

Biasing conditions to obtain 10 GHz active harmonic modelocking of the above-described system may be on the order of Ibias=40 mA, Vreverse=3 V, and RF drive (10 GHz)=17 dBm. The modelocked pulse train may be detected using the first output of tap 260 with a 20-GHz-bandwidth photodiode with the 10 GHz frequency component amplified electronically. The residual phase noise may be measured as a function of offset frequency from the carrier tone using a coherent homodyne technique. For these experiments, an Agilent™ E5501 phase-noise test set may be employed. The term residual phase noise refers to the added contribution of phase noise from the modelocked laser over and above that of the 10 GHz drive signal.

Figure 3:
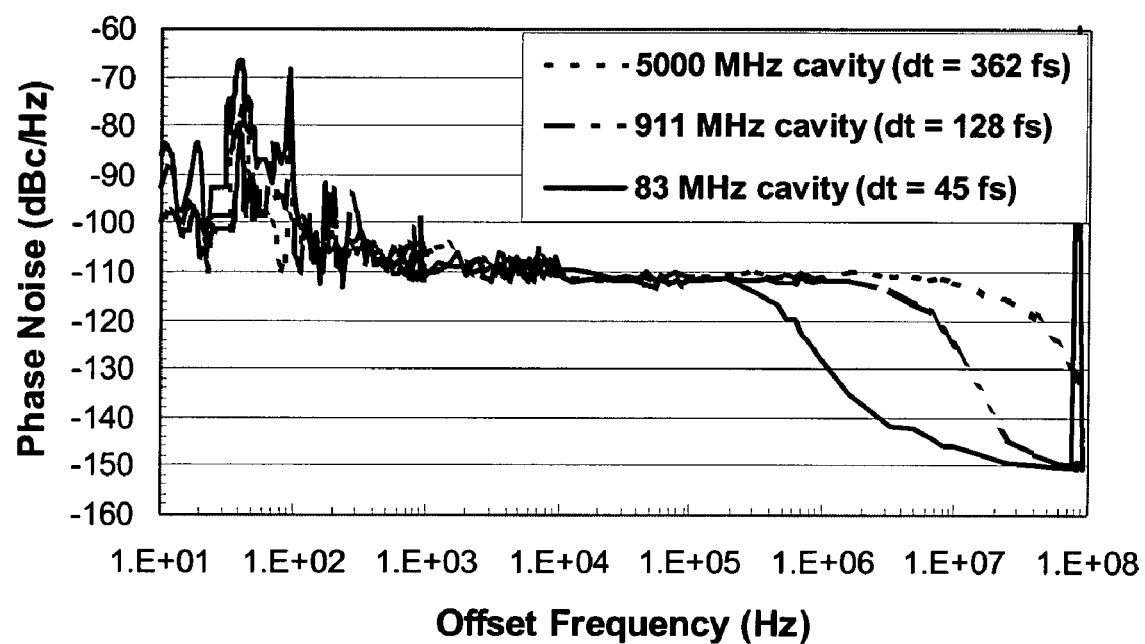
FIG. 3 illustrates phase noise vs. offset frequency for cavity lengths corresponding to 5000, 910 and 83 MHz mode spacings according to aspects of the present invention.

Referring now also to FIG. 3, phase noise may be measured vs. offset frequency for cavity lengths corresponding to 5000, 910 and 83 MHz mode spacings. Phase noise may be characterized by a white-noise plateau at ~−110 dBc/Hz. The phase noise rolls off as $\sim 1/f^2$ above a characteristic "knee" frequency $f_{knee}$ which decreases inversely with cavity length. The narrow-band spur at 83 MHz corresponds to cavity-mode beat noise, and being extrinsic it may be excluded from the jitter calculation, as spur suppression has been demonstrated in which the low frequency phase-noise is unaffected.

Figure 8:
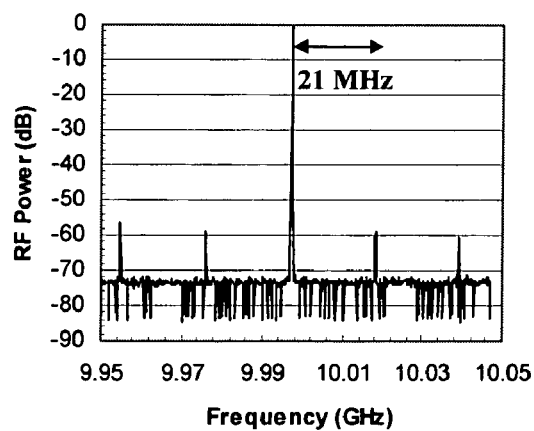
FIG. 8 illustrates an RF spectra according to an aspect of the present invention. Sigma cavity longitudinal mode spurs are shown to be 58 dB below the carrier (30 kHz RBW).
Figure 9:
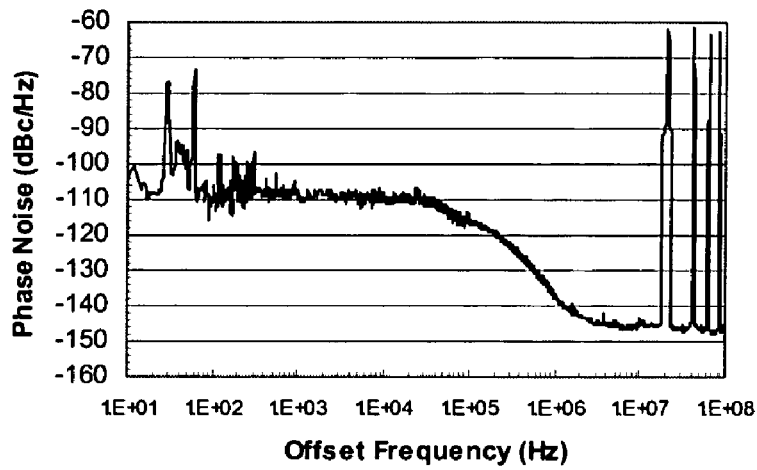
FIG. 9. illustrates a phase noise spectra of a sigma cavity laser according to an aspect of the present invention. Integrated low-frequency phase noise (10 Hz–10 MHz) is shown to give a jitter of about 25 fs.

The cavity mode spacing may be 21 MHz corresponding to a harmonic order of N~500. An exemplary modelocked RF spectra and residual phase noise associated with such a configuration is shown in FIGS. 8 and 9. The RF spectra shows cavity mode spurs 58-dB below the carrier (30 kHz RBW). The phase noise plot shows a white noise plateau at −110 dBc/Hz extending from 10 Hz to 40 kHz with the supermode spurs appearing at frequencies corresponding to the longitudinal mode harmonics. The resolution bandwidth of the phase-noise test set for offset frequencies greater than 10 MHz is 300 kHz, so the entire phase noise power is integrated in each spur. To obtain the timing jitter due to the low-frequency phase noise, the following relation is used:

$$\Delta t = \frac{1}{2\pi f_m} \sqrt{2 \int L(f) df}$$

where L(f) is the single-sideband phase-noise spectral density and $f_m$ is the modulation frequency. From this expression, the jitter (10 Hz–10 MHz) can be calculated to be 25 fs.

Figure 4:
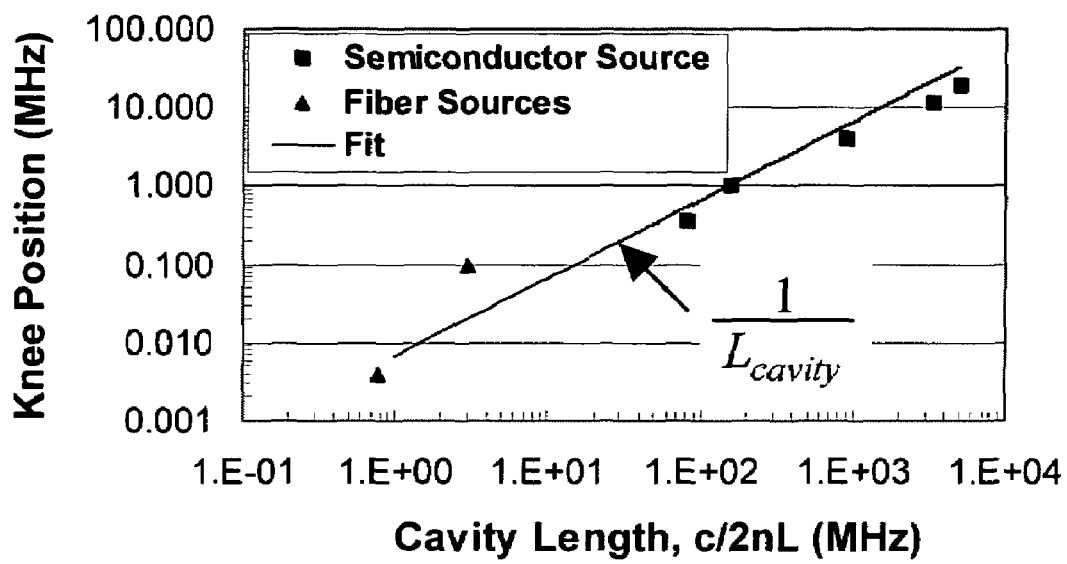
FIG. 4 illustrates jitter and knee position as functions of cavity length according to aspects of the present invention.
Figure 4:
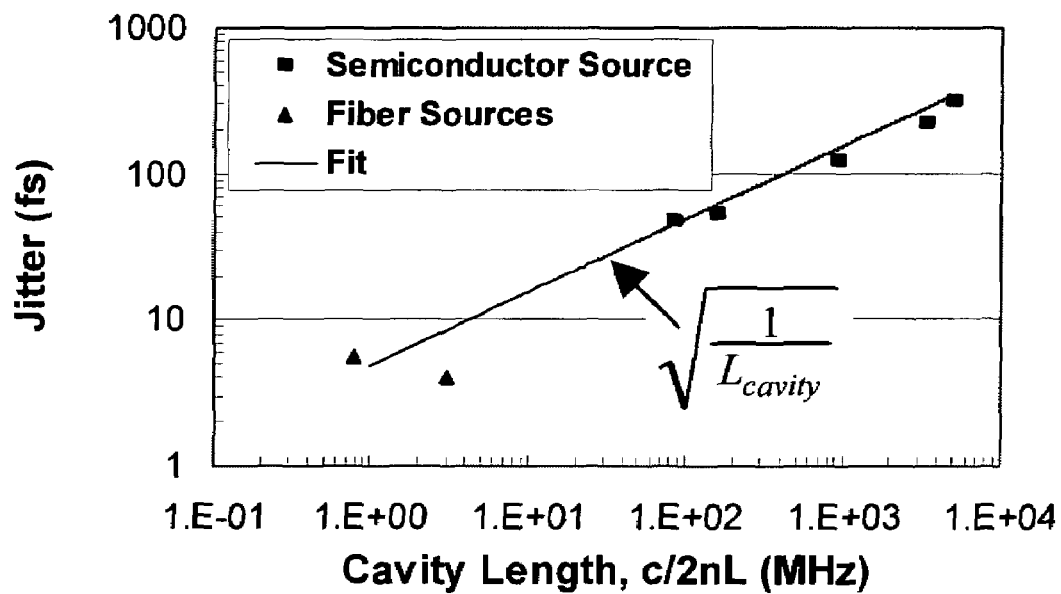

More specifically, the upper integration limit is ~$f_{knee}$ (as is demonstrated in FIG. 3), yielding:

$$\Delta t \approx \frac{1}{2\pi f_m} \sqrt{2 L_{J\_Plateau} \, f_{knee}} \propto \frac{1}{2\pi f_m} \sqrt{\frac{2 L_{J\_Plateau}}{L_{cavity}}}$$

where $L_{cavity}$ is resonator length. RMS jitter, Δt, (integration range 10 Hz to 100 MHz) and $f_{knee}$ are plotted vs. cavity length in FIG. 4, and follow the cavity-length fit quite well.

Extrapolating to longer cavities, one may compare semiconductor to erbium fiber modelocked sources. Jitter data for erbium fiber sources is available for 190 and ~50 meter cavities. This data confirms that the relationship between cavity length and jitter is obeyed, too, for modelocked fiber lasers.

Figure 5:
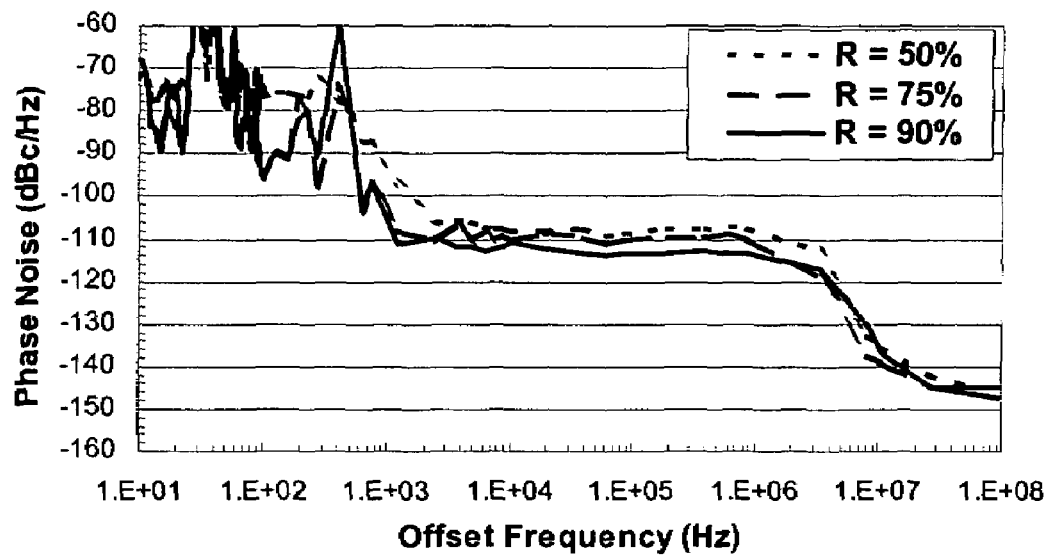
FIG. 5 illustrates phase noise versus offset frequencies as a function of cavity loss according to an aspect of the present invention.

As seen, roundtrip time, related to cavity Q, plays a strong role in determining the frequency profile of the phase noise, and hence timing jitter. Another factor influencing jitter is the optical loss within the cavity, which above lasing threshold clamps the gain. One may also consider the influence of cavity loss on phase noise for a fixed cavity length, with loss adjusted at the end mirror using output couplers of reflectivity 50, 75, and 90%. Referring now also to FIG. 5, the phase noise plateau, which appears substantially fixed in FIG. 3, may decrease by about 5 dB as the output coupler is varied from 50% to 90%. This can be understood by noting the connection between stimulated and spontaneous emission expressed by the Einstein relations. As the spontaneous emission rate is related to gain, reduced optical losses lead to a reduced spontaneous emission power. Since spontaneous emission causes phase noise, lower cavity losses leads to reduced jitter.

Figure 6:
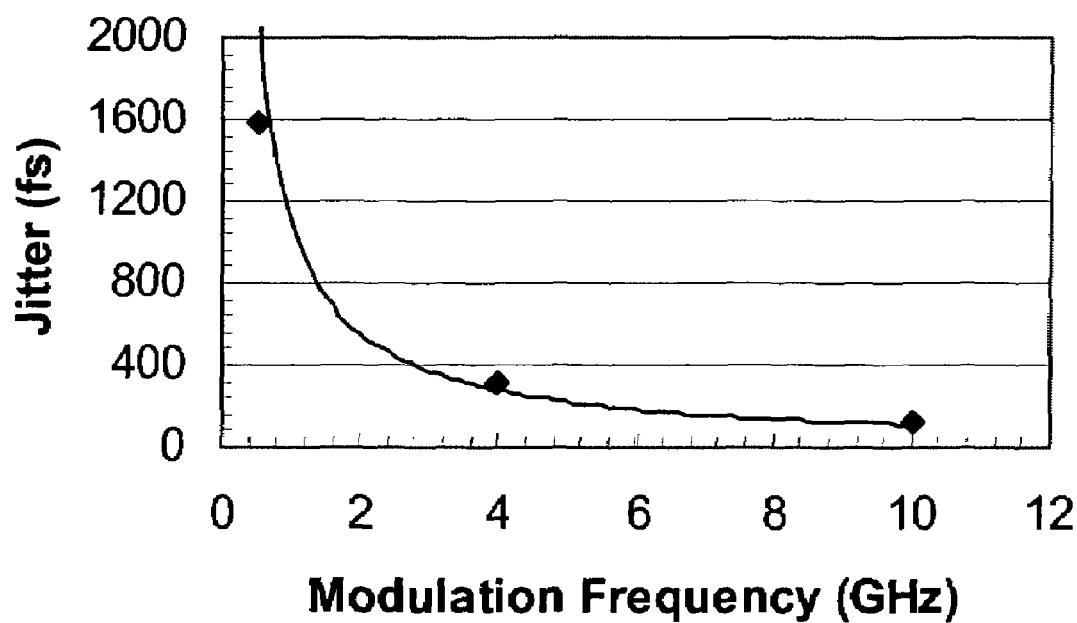
FIG. 6 illustrates achievable jitters according to an aspect of the present invention.

Further, phase noise may be characterized as a function of drive frequency while maintaining a fixed cavity length. Jitter may be measured (integration range 10 Hz–100 MHz) with the cavity actively modelocked at 0.5, 4.0, and 10 GHz. As phase noise is associated with photon lifetime, the measured phase-noise profile is similar for all modelocking rates. Therefore, and as is shown in FIG. 6, upon integration, the jitter may be found to vary as the inverse of the drive frequency, $f_m$, consistent with the above equations.

Thus, low jitter in modelocked lasers may be obtained through a high-Q low-loss cavity, regardless of gain medium. The longer photon lifetime associated with higher Q may be seen to mitigate against pulse-to-pulse phase fluctuation, and lead to low jitter. As spontaneous emission is related to the gain required to achieve lasing threshold, lower cavity losses lead to lower values of phase noise and, hence, lower jitter. Cavity losses in erbium fiber lasers are similar to those of semiconductor lasers owing to the losses of high-speed modulators required in the erbium designs. Jitter performance is universal and, to first order, independent of upper-state carrier lifetime. Indeed, by extrapolating to long cavities, the jitter of modelocked semiconductor lasers can compare favorably to that of the erbium fiber sources.

According to an aspect of the present invention, a modelocked laser module may be based on packaged high-speed gain elements and at least one semiconductor optical amplifier (SOA). The sigma-cavity may be configured as a harmonically modelocked cavity, followed by optical amplification stages. The SOA devices may be about 2.0 mm long with a 6° angled-stripe waveguide for reduced spectral modulation. Lensed-tip fiber may be used instead of bulk optics for diode-fiber coupling. The development of the packaged devices may include device characterization and selection, device burn-in, device packaging with standard single mode or polarization-maintaining lensed-tipped fiber, cavity construction, and system characterization.

Figure 10:
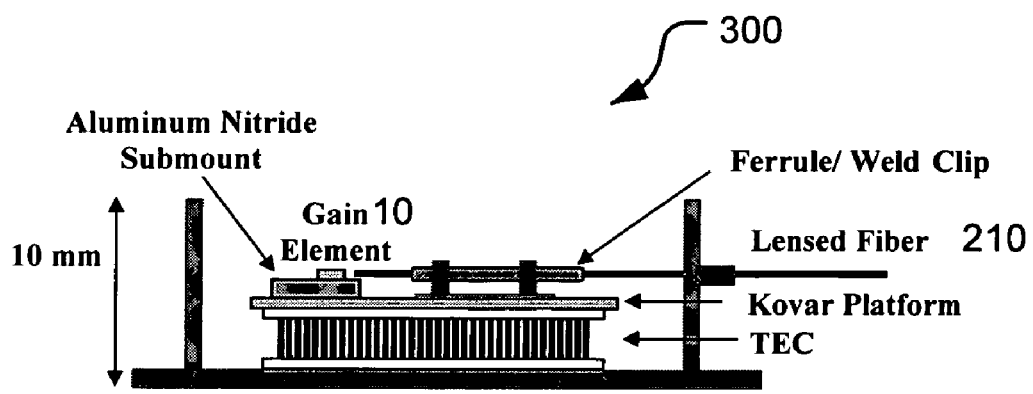
FIG. 10 illustrates a cross-sectional view of a packaged source device according to an aspect of the present invention. A SOA package may be similar except with PM or standard single mode fiber both in and out.
Figure 11:
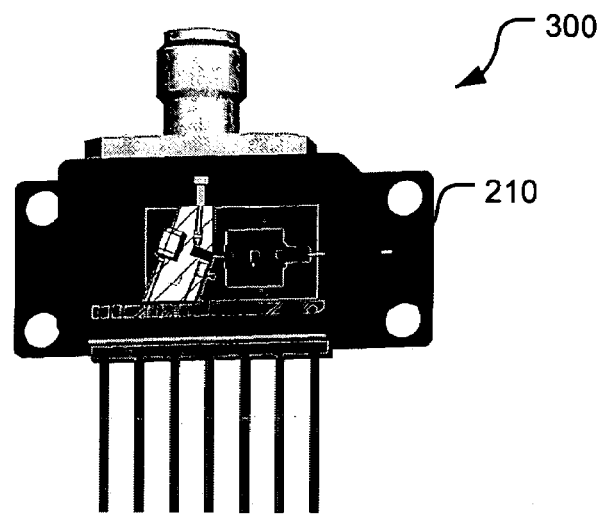
FIG. 11 illustrates a perspective view of a source package according to an aspect of the present invention. An RF drive is through a high-frequency bulkhead to a coplanar stripline patterned on an Aluminum Nitride submount.

Diagrams of a package layout for the low-capacitance gain elements according to an aspect of the present invention is shown in FIGS. 10 and 11. Standard sized gold-plated Kovar packages may be used, each with an outer footprint of 13 mm×30 mm, an inner tub area of 10 mm×19 mm, and a height of 10 mm. The package for the low-capacitance gain elements may include a high frequency (e.g., 20 GHz) RF connector brazed into one sidewall, 7 DC feedthrough pins, and a single tube for fiber output. The packages for the SOA devices may be 14-pin butterfly packages of the same size with two Kovar tube openings for fiber in and out. As shown in FIG. 10, the mounted diode and fiber may be built upon a Kovar platform that is soldered to a thermoelectric cooler (TEC), which in-turn is soldered to the package floor. The thickness of an aluminum nitride submount (0.8 mm) may be designed so that the optical mode is at the same height above the platform as the fiber tip. Preassembly of the packages included mounting of the TEC and Kovar platform. Kovar may be used for the platform and weld clips as it has a thermal expansion coefficient similar to InP and AlN, reducing thermal stresses, as well as a low thermal conductivity, conducive for laser welding.

Gold-plated aluminum nitride submounts for source devices may be patterned with a 10-GHz coplanar stripline from the RF connector center pin to the low-capacitance device contact pads. A 47-ohm chip resistor may be included for impedance matching and to prevent on-chip RF ringing. The submount may also include a separate contact area to allow a thermistor for temperature control and a back facet monitor. The submount for the SOA devices may have patterning only for device biasing and thermistor mount. The submount geometry may be designed to account for the 20° emission angle (with respect to normal of the chip facet) due to refraction from the emitting waveguide. The devices may be AuSn die-bonded to the submounts and short wirebonds made from the modulator and gain section contact pads to the submount. Wirebonds connecting the ground sections on either side of the coplanar stripline may be made to minimize ground loops. These devices may be characterized for wavelength and output power and then burned in, such as for 100 hours (source devices burned-in at 50 mA, amplifier devices at 200 mA). Following burn-in, the devices may be characterized again to allow selection of devices for packaging. Source devices selected for packaging may be soldered to the Kovar platform and final wirebonds made from the RF connector pin to the coplanar stripline and from ground on either side of the stripline to a ledge on the package wall (to ensure good ground return).

Lensed tipped polarization maintaining (PM) fiber may be used for diode-fiber coupling. Alternatively, single mode fiber may be used. PM patchcords containing an AR-coated 10 μm lens tip (radius-of-curvature) may provide ~65% coupling. A Kovar ferrule may be affixed to the fiber. The package may be placed within a laser welding system (Newport LW4500) with the fiber inserted through the package tube and held by the welder's pneumatically-actuated gripper. Monitoring the fiber output power, the fiber tip may be positioned using sub-micron resolution auto-align stages. A simple polarization monitor may be used for aligning the fiber rotation. An iterative process of fiber rotation and xyz-translation may be performed to optimize the fiber rotation angle and maximize diode-fiber coupling. Based on the polarization monitor, the aligned PM fiber extinction ratio may exceed 20-dB for the source devices, 25-dB for the SOA devices. Once the optimum position is located, a Kovar weld clip may be placed over the Kovar fiber ferrule and a series of precision laser welds performed to fix the position. The clip may be welded to the platform with six laser welds, three on either side of the clip base. Then the fiber may be repositioned to compensate for post-weld shifts and the fiber ferrule was laser-welded to the clip, also at six locations.

After the fiber is attached, a second iterative process may be performed. This may include thermal cycling the packages to relieve stresses built into the Kovar clip during the welding process and fiber repositioning by use of the auto-align stages. After several iterations it may be determined which packages were insensitive to the thermal cycle and useful for system construction.

The devices may be mounted on an Aluminum Nitride submount patterned to include a coplanar stripline for 10-GHz RF drive signal. Lensed-tipped, AR-coated, polarization maintaining (PM) fiber may be used for the fiber pigtail. Sub-micron auto-alignment may be used for translational positioning, and rotation alignment may be achieved for polarization extinction ratios greater than 20-dB. Laser welding of Kovar fixtures may be used to fix the fiber position.

In addition, angled-stripe semiconductor optical amplifiers may be packaged within 14-pin butterfly packages. Lensed-tipped, AR-coated, (PM or standard single mode) fiber may be used for fiber in and out connections. Thermoelectric cooler and thermistors may be used with the packages for temperature stabilization.

By way of non-limiting example only: the packaging may take the form of an Egide model COH021013K1488A 7-pin Butterfly with RF GPO Bulkhead; the fiber may take the form of Seikoh-Giken PMF Conical Lensed Fiber having a radius of curvature of about 10 μm, the submount may take the form of patterned Aluminum Nitride; the platform may take the form of gold plated Kovar, the ferrule may take the form of a La Precision model OF: 20439 gold plated Kovar ferrule, the weld clips may take the form of Olympic EDM Services, Inc. model 001043-000 Kovar, the TEC may take the form of a Melcor OT 2.0-30-F2A OptoTec Series device, strain relief may be provided by a Thorlabs model 190044-55 900 μm strain relief boot, the chip resistor may take the form of a Digi-Key model P47AGCT-ND 47 ohm resistor, the thermistor may take the form of a Betatherm model 10K3CG590 0.018×0.018×0.009 multi-layer resistor, the Back Facet Monitor. may take the form of a Fermionics model FD300S3(COS) epoxy ceramic with detector, and the GPO to SMA adapter may take the form of a Corning model 1A1F1-0503-01.

Figure 13:
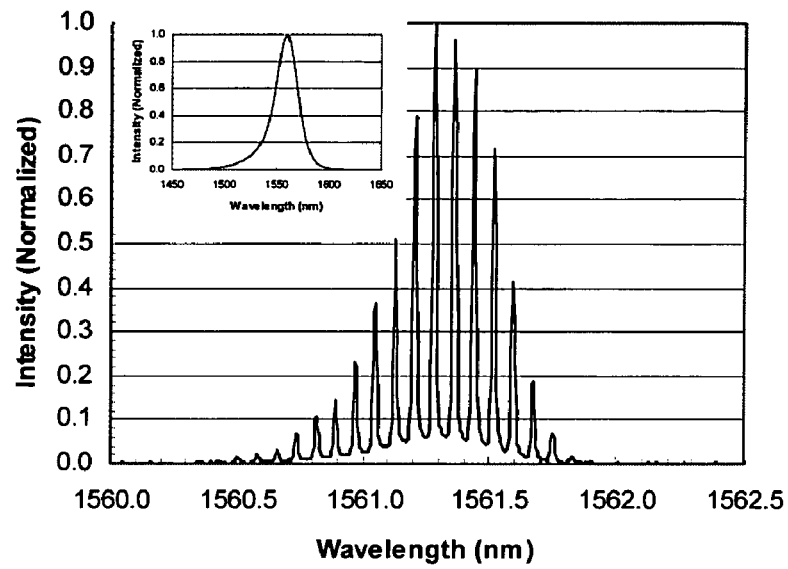
FIG. 13 illustrates a modelocked spectra of a packaged source device according to an aspect of the present invention. Modelocked bandwidth has about 6 modes. The inset shows below-threshold spectral emission
Figure 14:
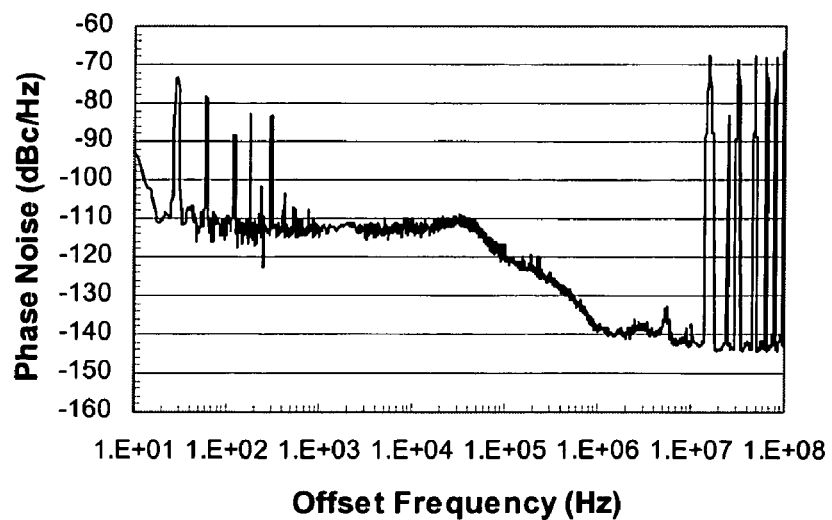
FIG. 14 illustrates a phase noise profile of a packaged harmonically modelocked laser according to an aspect of the present invention. The phase noise plateau is −110 dBc/Hz with a roll-off frequency at 40 kHz. Jitter (10 Hz–10 MHz) is 24 fs.
Figure 16:
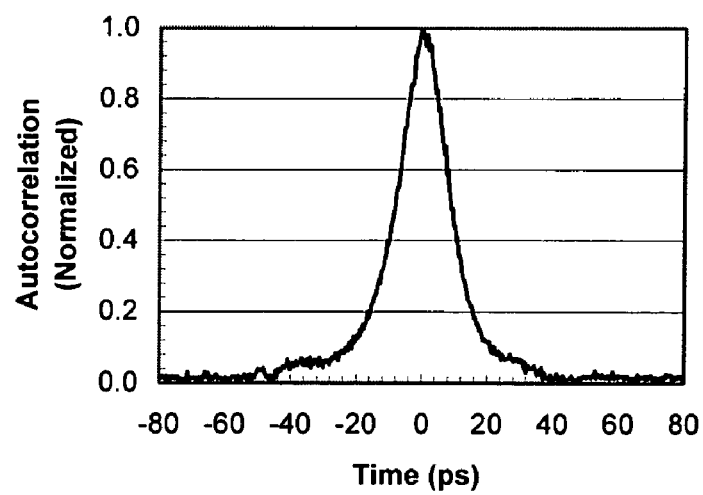
FIG. 16 illustrates autocorrelation of pulses from a modelocked sigma-cavity according to an aspect of the present invention where the pulse duration is 11 ps (deconvolved).
Figure 17:
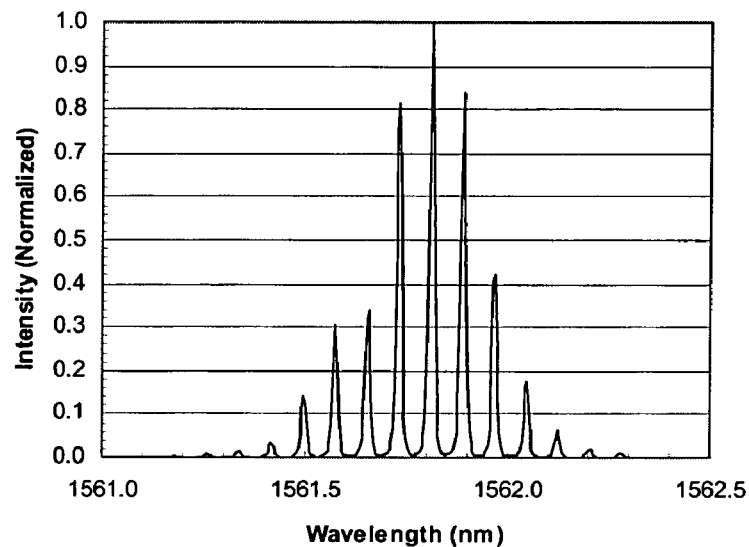
FIG. 17 illustrates a modelocked spectra according to an aspect of the present invention on a linear scale. Total bandwidth is 40 GHz, with well isolated 10-GHz modes.
Figure 18:
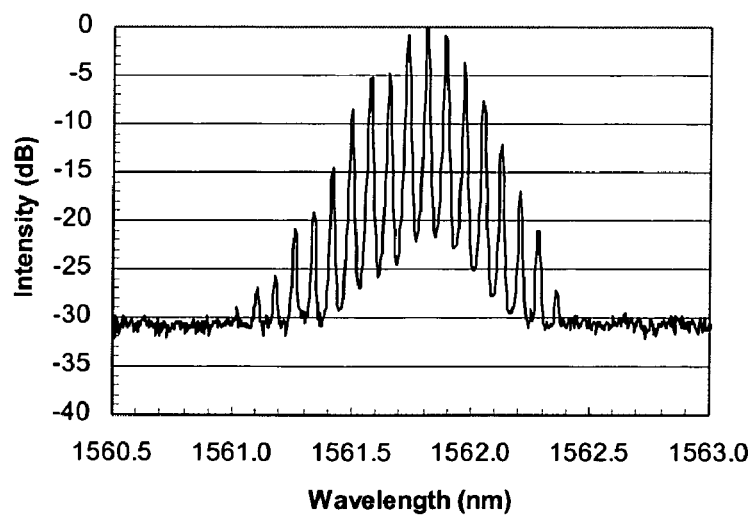
FIG. 18 illustrates a modelocked spectra according to an aspect of the present invention on a log scale. Mode isolation is greater than 20-dB.

The optical circulator may form the sigma loop, with the bent waveguide, low capacitance gain element placed in the linear portion of the sigma-cavity forming an approximately 17-MHz external cavity. As may be seen in FIGS. 14 and 16, modelocking at 10-GHz provides pulses of 10-ps duration with sub-20 fs timing jitter. The modelocked bandwidth includes several locked modes, as can be seen in FIG. 13. With the incorporation of a high-finesse etalon and variable delay line within the loop, jitter of 30-fs was obtained (1 kHz-100 MHz) with suppressed supermode spurs. Corresponding to suppressed supermode groups, the optical spectra shows modes with an enhanced dynamic range, as is illustrated in FIGS. 17 and 18.

Achievable average power in the output fiber may be about 100-μW. When injected into a packaged SOA, the in-fiber average output powers may exceed 15 mW. At 10 GHz, the harmonically modelocked laser may emit pulses of 6 ps duration as measured by autocorrelation. They may be detected with a 20-GHz-bandwidth photodiode with the 10 GHz frequency component amplified electronically. When coherently detected, the residual phase noise may be obtained as a function of offset frequency from the carrier tone. An Agilent™ E5501 phase-noise test set may be used for this purpose. The term residual phase noise as used herein refers to the added contribution of phase noise of the modelocked laser over and above that of the 10 GHz drive signal.

Figure 12:
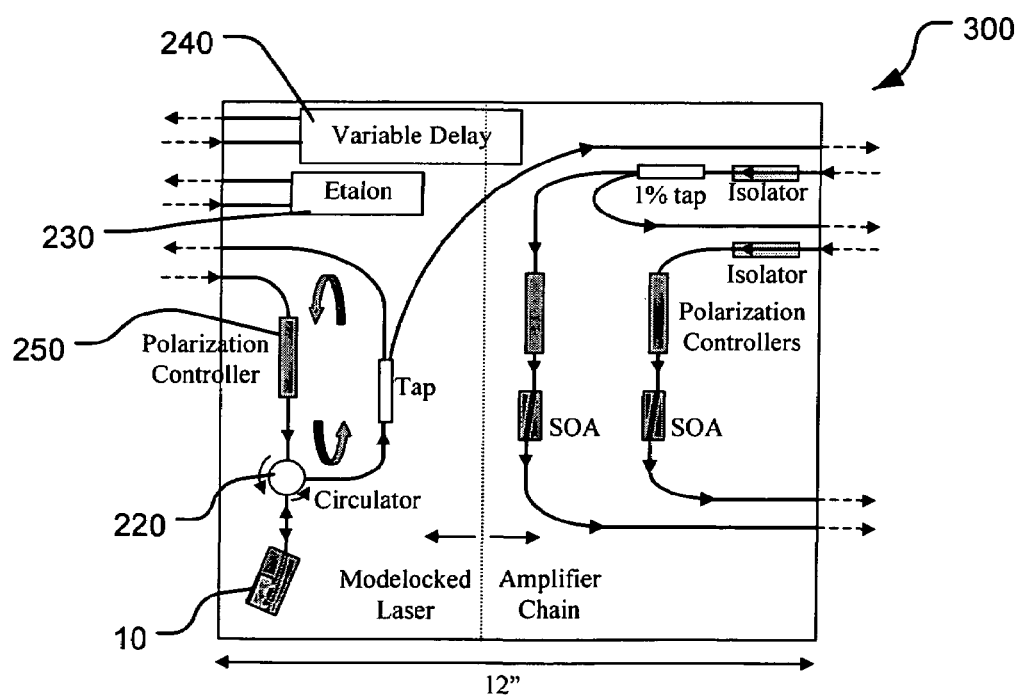
FIG. 12 illustrates a schematic view of a packaged modelocked laser system adapted for flexible configuration according to an aspect of the present invention. Fiber connectors are accessible through side patch panels allowing elements such as high-finesse etalon and variable delay line to be incorporated into the modelocked sigma cavity.

Referring now to FIGS. 10, 11 and 12, there are shown a system 300 according to an aspect of the present invention. Elements common to those of FIG. 7 have been analogously numbered and hence will not be discussed in detail again. The modelocked laser system 300 may be built upon a 12"×12"×0.5" optical breadboard. Electrical connections may be made through D-sub connectors on the backplane and the RF drive was accessed through an SMA bulkhead mounted on the side panel. The system may be designed for flexible configuration with all fiber connections accessible through a side panel containing fiber bulkheads. The sigma cavity loop may be open, allowing inclusion of bare-fiber, an in-line etalon filter, an in-line bandpass filter, and/or an in-line variable-delay line through the use of external patch-cord components. The modelocked output as well as both input and output connections to amplification stages may be routed through the side patch panel.

Figure 15:
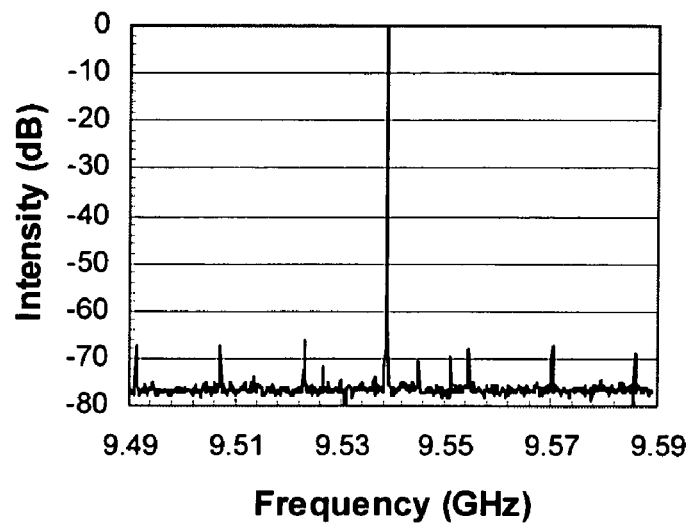
FIG. 15 illustrates an RF spectra of a packaged modelocked laser cavity according to an aspect of the present invention. Under harmonic modelocking, the cavity mode spurs are at a level of 67-dB below the carrier (RBW=3 kHz).

Without including the etalon 230 or delay line 240, lasing threshold may be about 28 mA. The 10 GHz modelocked optical spectra is shown in FIG. 13 to have a bandwidth of about 60 GHz. The below-threshold spectrum of source device 10 is shown in the inset. Modelocked output power may be about 120 μW. After amplification to 1 mW average power, the RF spectra, phase-noise, and pulse duration may be measured. The RF spectra (shown in FIG. 15) shows cavity mode spurs 67-dB below the carrier, spaced at frequencies of 15.5 MHz. The phase noise again shows a white-noise plateau at −110 dBc/Hz rolling off at ~40 kHz offset frequency corresponding to a jitter of 24 fs (10 Hz–10 MHz) (shown in FIG. 14). The pulse duration as given by optical autocorrelation may be around 11 ps (deconvolved; as is shown in FIG. 16).

Figure 19:
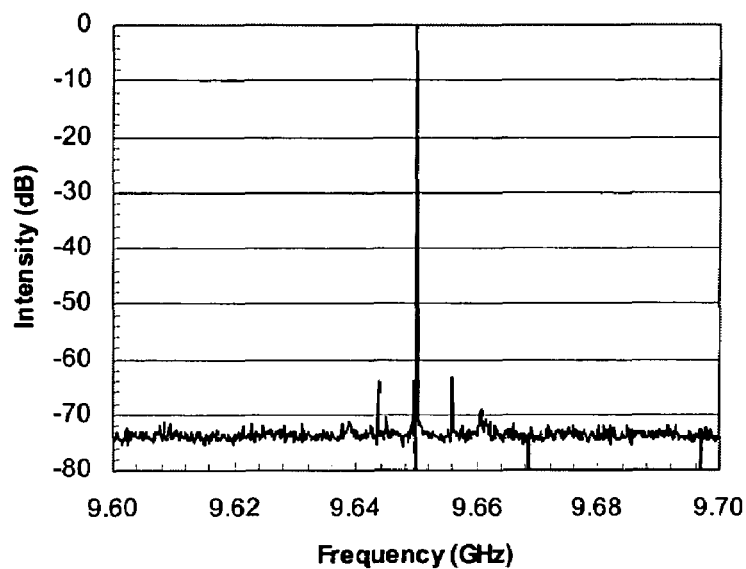
FIG. 19 illustrates an RF spectra according to an aspect of the present invention. No cavity modes are seen (RBW=3 kHz) with use of intracavity etalon, an indication of supermode spur suppression.
Figure 20:
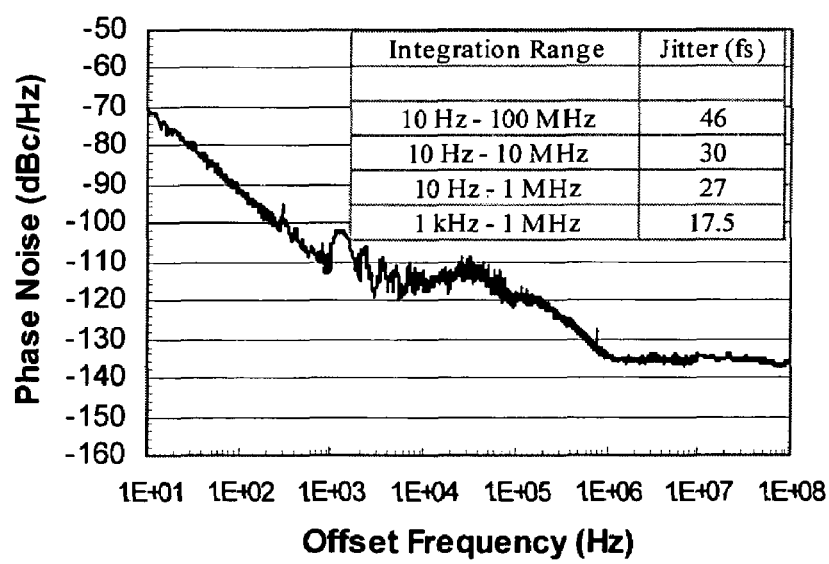
FIG. 20 illustrates phase noise spectra that shows no supermode spurs. The high-finesse etalon provides spur suppression of at least 25-dB. Jitter (1 kHz-1 MHz) is 17.5 fs.

As set forth, etalon 230 may be incorporated into the sigma cavity through external patchcords. The etalon may take the form of a temperature stabilized Fabry-Perot filter with a finesse of around 600 and an FSR of about 9.65 GHz. The RF drive frequency may be tuned to this rate and the cavity length adjusted to match the etalon and RF drive by use of an in-line variable delay line. An exemplary modelocked optical spectra is shown in FIGS. 17 and 18 (linear and log scale). This spectra shows a narrower modelocked bandwidth (about 40 GHz) but with much stronger isolation between the modes (22 dB). The narrower bandwidth may be due to dispersion in the cavity that de-tunes the modes with respect to the etalon filter. Associated RF spectra and phase noise are shown in FIGS. 19 and 20. The RF spectra shows that the cavity mode spurs may be suppressed below the noise floor of the spectrum analyzer (FIG. 19). The phase noise (FIG. 20) again shows a plateau at about −110 dBc/Hz, but with a strong increase in the phase noise at low offset frequencies (below 1 kHz). At offset frequencies above 10 MHz, however, the phase-noise shows no supermode spurs down to a level of −135 dBc/Hz, a suppression of more than 25 dB. The timing jitter calculated from this phase noise is 46 fs (10 Hz–100 MHz). The jitter given over the range of white phase noise (1 kHz-1 MHz) is 17 fs. The table inset in FIG. 20 gives the value of timing jitter over various integration ranges.

Figure 21:
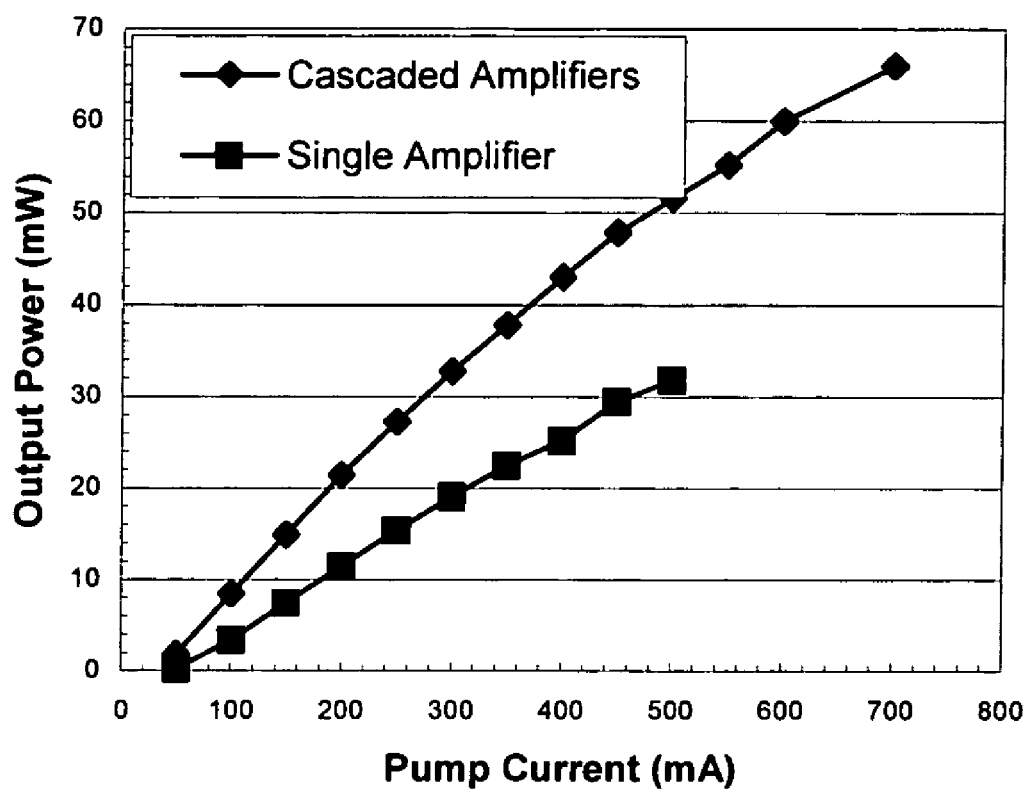
FIG. 21 illustrates an average output power of single and cascaded amplifier stages according to aspects of the present invention. And, FIG. 22 illustrates a system according to an aspect of the present invention.
Figure 22:
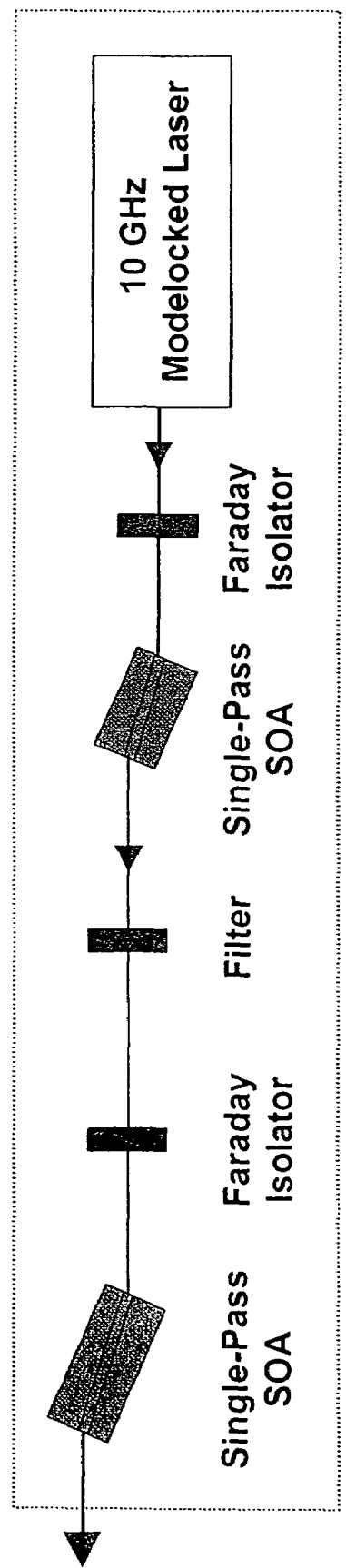

As set forth, one or more packaged semiconductor amplifiers may be used. Referring now also to FIG. 22, the present invention will be discussed as it relates to the inclusion of two such amplifiers for sake of explanation only. The average output power from a single SOA injected with the modelocked pulsetrain is shown in FIG. 21 (squares). The pulse quality degrades when the amplifier is biased at currents above 200 mA due to competition with ASE (amplified spontaneous emission). This corresponds to an average in-fiber power of 10 mW. FIG. 21 (diamonds) shows the average output power when two cascaded SOAs are used. The first amplifier may be seeded and biased at 150 mA. Average output power of over 40 mW (in-fiber) is available with pump currents of 400 mA. Mid-span filtering and Faraday isolation are needed to de-couple ASE seeding from first SOA into the second.

Thus, low-capacitance, two-section gain elements are shown to generate low-jitter optical pulses when aligned to an external-cavity harmonically modelocked sigma-cavity (25 fs, 10 Hz–10 MHz). Devices may be packaged with lensed PM or standard single mode fiber within standard-sized Kovar packages and an in-line harmonically modelocked sigma cavity constructed. Residual phase noise measurements show white-noise level at −110 dBc/Hz up to 40 kHz with supermode spurs occurring at the cavity harmonics. Inclusion of a high-finesse etalon (F=600) allows suppression of the supermode spurs by more than 25-dB yielding a jitter of 46 fs (10 Hz–100 MHz), 17.5 fs over an integration range of 1 kHz-1 MHz.

According to an aspect of the invention, straight waveguide monolithic multi-section modelocked laser, with active or passive modelocking may also be utilized, in place of the curved waveguide. In such a case, an external cavity may not be utilized. The waveguide is normal to both facets, and the modelocking rate (pulse repetition rate) is determined by the round-trip time, and hence the chip length. DBR end mirrors can be used to reduce the uncertainty in repetition rate due to cleaving errors. An analogous low-capacitance approach to that described above may be implemented.

It will be apparent to those skilled in the art that various modifications and variations may be made in the apparatus and process of the present invention without departing from the spirit or scope of the invention. Thus, it is intended that the present invention cover the modification and variations of this invention provided they come within the scope of the appended claims and their equivalents.

What is claimed is:

1. A low-jitter optical pulse source comprising:
    an optical monolithic waveguide comprising a first section substantially normal to a first facet and a second section being curved and non-normal to a second facet; and,
    an optical circulator coupled to said monolithic waveguide and forming a sigma cavity in combination with said monolithic waveguide, wherein said first facet forms a sole reflector in said sigma cavity.

2. The source of claim 1, further comprising a variable delay device optically coupled to said optical coupler.

3. The source of claim 2, wherein said monolithic waveguide is coupled to an input/output of said circulator and said variable delay line is coupled between and output of said optical circulator and an input of said optical circulator.

4. The source of claim 3, further comprising a tap coupled between sad output and input of said optical circulator.

5. The source of claim 4, further comprising optical fiber coupling said variable delay device to said input of said optical circulator.

6. The source of claim 1, wherein the source produces a periodic pulse train having a frequency of at least about 10 GHz and a jitter of less than about 30 fs.

7. The source of claim 1, when said waveguide is etched to define said first and second sections.

8. The source of claim 7, wherein said first section is suitable for performing absorption and modulation and said second section is suitable for providing gain.

9. The source of claim 1, wherein said first section comprises at least about 60 μm of substantially straight waveguide.

10. The source of claim 9, wherein said second section comprises at least about 530 μm of curved waveguide.

11. The source of claim 10, wherein said second section comprises less than about 1500 μm of curved waveguide.

12. The source of claim 10, wherein said second section forms an about 6° angle from normal with said second facet.

13. The source of claim 12, wherein said first facet is highly reflective coated and said second facet is anti-reflective coated.

14. The source of claim 1, wherein said waveguide is InP or GaAs based.

* * * * *